United States Patent [19]

Zheng

[11] Patent Number: 5,100,835

[45] Date of Patent: Mar. 31, 1992

[54] SHALLOW OHMIC CONTACTS TO N-GAAS

[75] Inventor: Long-ru Zheng, Webster, N.Y.

[73] Assignee: Eastman Kodak Company, Rochester, N.Y.

[21] Appl. No.: 670,636

[22] Filed: Mar. 18, 1991

[51] Int. Cl.$^5$ .................... H01L 21/44; H01L 21/48
[52] U.S. Cl. .................... 437/184; 437/187; 437/189; 437/190; 148/DIG. 20; 357/65; 357/71
[58] Field of Search ............ 437/180, 187, 189, 190; 148/DIG. 20, DIG. 58, DIG. 59; 357/65, 71

[56] References Cited

U.S. PATENT DOCUMENTS

| | | | |
|---|---|---|---|
| 4,011,583 | 3/1977 | Levinstein et al. | 437/184 |
| 4,186,410 | 1/1980 | Cho et al. | 437/184 |
| 4,301,188 | 11/1981 | Niehaus | 437/189 |
| 4,310,570 | 1/1982 | Calviello | 437/184 |
| 4,366,186 | 12/1982 | Keramidas et al. | 437/184 |
| 4,471,005 | 9/1984 | Cheng et al. | 437/134 |
| 4,989,065 | 1/1991 | Tsuchimoto et al. | 437/184 |

Primary Examiner—Brian E. Hearn
Assistant Examiner—Kevin M. Picardat
Attorney, Agent, or Firm—Raymond L. Owens

[57] ABSTRACT

The formation of low-resistance ohmic contacts to N-GaAs is provided by sequential deposition of Pd/Au-Ge/Ag/Au and rapid thermal annealing.

2 Claims, 1 Drawing Sheet

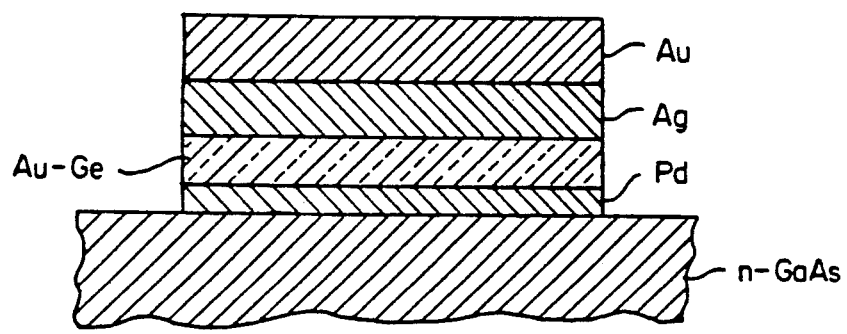

SHALLOW OHMIC CONTACTS TO N-GAAS

FIELD OF THE INVENTION

The present invention relates to shallow ohmic contacts for n-type gallium arsenide substrates and a method of making such contact.

BACKGROUND OF THE INVENTION

In a design of GaAs devices it is important to provide low resistant ohmic contact, that has a uniform interface which contacts the GaAs substrate. Surface protrusions or dendrites are undesirable. In one conventional system, Ni, Au-Ge, Ni and Au layers are sequentially deposited on the surface of gallium arsenide. This system has been extensively used, however, it suffers from a number of problems. The reaction of this system at the interface with the gallium arsenide is non-uniform and produces dendrites which can deeply penetrate into the gallium arsenide substrate and seriously limits the device performance. Another disadvantage is that the contact resistivity is non-reproducible. The non-uniformity is attributed to the reaction involving some liquid phases and the presence of interfacial oxides. When devices are scaled down to submicron dimensions, non-uniformity of the interface microstructure could seriously limit the device performance.

In U.S. Pat. No. 4,301,188 to Niehaus another process for producing contacts to gallium arsenide substrates is shown. In this arrangement a gold germanium alloy is directly deposited on a gallium arsenide surface. Onto the gold germanium layer there is deposited a silver layer and onto this silver layer is deposited a gold layer. This arrangement significantly reduces dendrites, but as shown in the comparative example later in the Detailed Description of the Invention, it still suffers from some problems.

SUMMARY OF THE INVENTION

It is an object of this invention to develop an improved shallow ohmic contact to n-type gallium arsenide substrate.

In accordance with this invention a shallow ohmic contact to a n-type gallium arsenide substrate comprises: (a) a thin layer of palladium formed on the surface of the gallium arsenide substrate; (b) a layer of AuGe formed on the Pd layer; (c) a layer of Ag formed on the AuGe layer; and (d) a layer of Au formed on the Ag layer.

A feature of this invention is that the room temperature reaction of palladium with gallium arsenide substrate brings benefits to metallization: (1) it disperses interfacial oxides, resulting in uniform contact formation; (2) it improves the adherence of the contacts to GaAs; and (3) it provides possibilities for contact formation through solid phase reaction. Both interface and surface have been found to be exceptionally smooth, and the diffusion depth of the metallization is about 200-300Å. Shallow ohmic contacts produced in accordance with this invention have a low contact resistivity of $2-3 \times 10^{-6}$ ohm-cm$^2$ and excellent morphology.

BRIEF DESCRIPTION OF THE DRAWINGS

The drawing is a schematic cross-section of a shallow ohmic contact to a gallium arsenide substrate made in accordance with this invention.

DETAILED DESCRIPTION OF THE PREFERRED EMBODIMENTS

In accordance with this invention, an ohmic contact to n-type GaAs is provided by using sequential deposition of Pd/Au-Ge/Ag/Au and rapid thermal annealing. This metallization has a low contact resistance of $2-3$ $10^{-6}$ ohm-cm$^2$, comparable to that of the alloyed Ni-Au-Ge contact prepared at optimum conditions. The metal-substrate reaction is extremely limited and the interface is smooth. Because of the uniform interface and the small diffusion depth of the metallization, the contact is ideal for devices, in which a shallow junction is required. In addition, the contact has an Au-Ag surface layer, compatible with the subsequent metallization.

Turning now to the drawing, there is shown a n-type gallium arsenide substrate 10. With a carrier concentration of $1-2 \times 10^{17}$/cm$^3$. Whenever the term "n-GaAs substrate" is used, it will be understood that only the top layer of the substrate structure needs to be n-type GaAs. This is because only a thin surface layer of n-GaAs of 10-20 nm is needed to provide the contact. Therefore, as a specific example, the substrate could be a AlGaAs/GaAs heterojunction structure. This substrate is loaded in a vacuum system. In this system the vacuum can conveniently be at about $10^{-6}$ Torr. The vacuum system can, of course, include a conventional resistive heating system which evaporates different materials placed in different crucible. When a material is evaporated, its crucible is placed in operative relation with a heater system. An example of such a vacuum system is "SC-5000 High Vacuum Evaporator" manufactured by CVC Products Inc. Palladium is loaded in a crucible and heated to a point where it evaporates and deposits upon the surface of the gallium arsenide. It has been found preferable that the palladium should have a thickness of between 20-100Å. After the palladium is appropriately deposited, without breaking the vacuum a crucible containing an alloy of gold germanium is moved into operative relation to the heater. The heater then heats the gold germanium until it evaporates and deposits onto the surface of the palladium. The gold germanium should have a thickness range of from 200-1500Å. In addition to which, the germanium in this alloy can have a range of 15-50% of atomic percent. After the appropriate thickness of the gold germanium layer has been produced a crucible containing silver is then disposed over the heater and it in turn is heated to produce a layer having a thickness of 500-1500Å. Finally a crucible containing gold is disposed over the heaters and a gold is evaporated to form a layer of from 500 to 3000Å. The resulting structure is then subjected to rapid thermal annealing at 375°-500° C. for 10-60 seconds.

A substantial amount of Au and Ag is needed to obtain low sheet resistance, while the upper value of their thickness should be limited for this metallization scheme compatible with device processing. A sufficient amount of Ge is needed to produce a Ge-doped GaAs layer for contact formation, but the structure with an Au-Ge layer thicker than 1500Å would exhibit morphological degradation after processing. The amount of Pd should be enough to cover the entire GaAs surface and form a Pd-GaAs layer with a thickness of 20-30Å. Thicker Pd layers would not bring any benefit to contact performance. The annealing temperature higher than 500° C. or the annealing time longer than 60 seconds would produce morphological degradation.

The temperature lower than 375° C. or the time less than 10 seconds would increase the contact resistance.

Experimental Procedure

Undoped semi-insulating GaAs substrates in (100) orientation were degreased in organic solutions and then etched in $H_3PO_4:H_2O_2:H_2O = 3:1:100$. Prior to loading into an evaporator, the wafers were rinsed in deionized water and etched in a 50% HCl solution until they were completely hydrophobic. Metal films were sequentially deposited on wafers by resistive heating at a pressure of about $10^{-6}$ Torr to form a layered structure of Pd (5 nm)/Au-Ge eutectic (100 nm)/Ag (100 nm)/Au (100 nm).

For specific contact resistance and sheet resistance measurements, samples with transmission line mode (TLM) and van der Pauw patterns were prepared. To form conducting channels on (100) GaAs, dual Si implantation was carried out through a 120 nm thick Si-nitride layer using photoresist as the ion beam mask. The 160 keV Si profile at a dose of $5 \times 10^{12}/cm^2$ was peaked near the GaAs surface and the 280 keV implant at a dose of $1 \times 10^{13}/cm^2$ provided a much deeper profile. Activation at 950° C. for 10 seconds resulted in a surface carrier concentration of approximately $2 \times 10^{17}/cm^3$. The activated sample was subjected to plasma etching of Si-nitride to define contact strips. Sequential deposition and lift off were performed to produce desired device geometry structures. The thickness of the individual layer in the device geometry structure was identical to that used in the planar structure, except that the thickness of the surface Au layer was increased to 250 nm.

EXAMPLE 1

The sample of GaAs/Pd/Au-Ge/Ag/Au was thermally processed in flowing $N_2$ ambient for 30 sec at temperatures varying from 350° to 500° C. The diffusion and dissolution of Ag in Au occurred at 350° C. and resulted in a uniform mixed layer after annealing at 450° C. No significant change was observed in the Ga and As profiles of Rutherford Backscattering Spectrometry (RBS), indicating a limited interfacial reaction of GaAs with metal overlayers. X-ray diffraction measurements showed that the Au and Ag reflection lines retained their original intensity after annealing and no additional peaks corresponding to compound formation were observed.

Auger electron profiles indicated a uniform mixing between gold and silver with no indication of metal penetration into the substrate. Both Ga and As in the mixed metal layer were below the sensitivity of Auger Electron Spectrometry (AES). It was also found that the Ge remained near the metal-GaAs interface.

The limited metal-GaAs reaction was further confirmed by cross-sectional Transmission Electron Microscopy (TEM) measurements. TEM micrographs showed that a reacted layer was formed at the metal-GaAs interface after annealing at 450° C. for 30 seconds, which was quite uniform over the examined area with a thickness of the order of 20-30 nm.

Sequential deposition and lift off produced well defined contact strips on GaAs. After processing at 450° C. for 30 seconds, the metal overlayers exhibited a smooth surface and good adherence to the substrate. The metal-GaAs interface was planar and abrupt, as indicated by Scanning Electron Microscopy (SEM) analysis on cleaved surfaces of an annealed sample.

Electrical measurements with transmission line mode showed a contact resistivity of $3.6 \times 10^{-6}$ ohm-$cm^2$ at a surface carrier concentration of $2 \times 10^{17}/cm^3$. Both electrical and material properties are quite reproducible. No substantial variation was observed from sample to sample and from run to run. It is of interest to note that the contact resistivity after RTA at 400° and 500° C. is about $7 \times 10^{-6}$ and $2 \times 10^{-6}$ ohm-$cm^2$ respectively, and that the interface remains sharp even after the 500° C. anneal.

EXAMPLE 2

The same sample configuration was used, as described in Example 1, except that Ni replaced Pd as the first layer. RBS measurements on a GaAs/Ni/Au-Ge/Ag/Au sample showed that interdiffusion between Au and Ag occurred at 350° C. and proceeded with increasing temperature. After a 30 second anneal at 450° C., the diffusion profiles were practically flat through the thickness of the films. It was also found that the interface between metals and GaAs remained relatively sharp.

Adhesion difficulties have been experienced in the device geometry structure after thermal annealing. The metal did not adhere well to all the contact area. The contacts annealed at 450°-500° C. had of about $2-3 \times 10^{-5}$ ohm-$cm^2$. Both contact resistivities and adhesion were improved with increasing temperature, whereas severe interfacial reaction and morphological degradation were observed as well.

EXAMPLE 3

The sample was prepared by sequential deposition with a configuration of GaAs/AuGe(40 nm)/Ag(100 nm)/Au(1250 nm). The contact resistivity was $5 \times 10^{-4}$ ohm-$cm^2$ after 15 seconds at 400° C., which is about 60 times higher than that obtained in Example 1. The resistivity was $1 \times 10^{-5}$ ohm-$cm^2$ after 15 sec at 450° C. which is about 3 times higher than that shown in Example 1. The interface between metal and GaAs is relatively broad with dendrities of about 100 nm in depth, while the broadening of the interface in Example 1 is only about 20 nm. The mechanism for contact formation is similar to that reported in conventional Au-Ge metallization. Since the AuGe layer is directly deposited on GaAs, the contact reaction would be strongly dependent on the presence of interfacial oxides. As a result, contact resistivity and film adhesion would vary substantially with processing conditions.

EXAMPLE 4

The same sample configuration was used, as described in Example 2, except that Ni replaced Ag as an intermediate layer between Au-Ge and Au. RBS measurements on a GaAs/Ni/Au-Ge/Ni/Au sample revealed substantial Au in-diffusion and Ga out-diffusion after annealing at 400° C. or above. This penetration was nonuniform, generally in the form of spikes. A fraction of the Ni diffused into the surface Au layer and the rest of the Ni migrated toward the contact-GaAs interface. The diffusion depth of Au and Ni was about 200 nm. X-ray measurements showed that the Au reflection lines diminished and disappeared after annealing. A number of new peaks emerged in the diffraction pattern and were identified as the $Au_7Ga_2$ and NiAs phases. Morphological degradation was observed in the device geometry structure. The contacts tended to "ball up" and bubble-like features were shown on the surface.

Ohmic behaviors were observed after a 400° C. anneal with a contact resistivity of $3 \times 10^{-4}$ ohm-cm$^2$. The resistivity dropped to $5 \times 10^{-5}$ ohm-cm$^2$ after a 450° C. anneal and further decreased with increasing temperature. However, the improved electrical property was accompanied by severe interfacial reaction and morphological degradation.

EXAMPLE 5

Sequential deposition of Pd (5 nm) and Au-Ge eutectic (100 nm) on n-type GaAS was carried out to form a structure of GaAs/Pd/Au-Ge. A 30 second anneal at 340° C., a temperature below the Au-Ge eutectic, resulted in substantial gallium and arsenic outdiffusion and gold indiffusion. The extent of the interaction was found to increase with time. Complete melting of the metallization occurred at temperatures of about 450° C. with an Au penetration depth of several hundreds of nanometers.

EXPLANATIONS

In the conventional Au-Ge metallization, the contact is spatially nonuniform with regions of deep Au penetration into the GaAs. The nonuniform contacts are attributed to the reaction involving some liquid phases and the existence of the GaAs native oxides (See Example 4).

Using silver to replace nickel significantly limits the contact-substrate reaction. Au-Ag solid solutions are formed upon annealing to impede Au indiffusion and increase the eutectic temperature. When Pd is used as the first layer, it reacts with GaAs to form a ternary phase at room temperature and disperse the interfacial oxides. The subsequent reaction depends on processing temperature. 1) When the temperature is below the Au-Ag-Ge eutectic, the reaction occurs between Ge and the ternary, resulting in the decomposition of the ternary phase and epitaxial regrowth of a Ge-doped GaAs layer. As a result, uniform ohmic contacts with good adherence to n-GaAs were formed. 2) When the temperature is above the Au- Ag-Ge eutectic, the contact may form via liquid phase reaction. However, the interface between contacts and GaAs is uniform due to dispersion of interfacial oxides by Pd and the reaction is limited due to the formation of Au-Ag solutions. In addition, the presence of an Au-containing layer next to the substrate may result in an excess of Ga vacancies in the GaAs beneath the contact, which would cause preferential donor behavior of the amphoteric germanium (See Example 1).

When Ni is used as the first layer, it reacts with GaAs at temperatures of 250°-300° C. The reaction is sensitive to the existence of the GaAs native oxides, resulting in nonuniform contact formation and poor adhesion to the substrate (Example 2). When Au-Ge is directed deposited on GaAs, the contact resistance is relatively high and the effect of native oxides on contact properties is severe (See Example 3).

The invention has been described in detail with particular reference to certain preferred embodiments thereof, but it will be understood that variations and modifications can be effected within the spirit and scope of the invention.

I claim:

1. A shallow ohmic contact to an n-type gallium arsenide substrate, comprising:
    (a) a layer of Pd formed on the surface of the gallium arsenide substrate and having a thickness of 20-100A;
    (b) a layer of gold germanium formed on the Pd layer and having a thickness of 200-1500A, wherein the germanium has a range of 15-50 atomic percent;
    (c) a layer of silver formed on the gold germanium layer and having a thickness of 500-1500A; and
    (d) a layer of gold formed on the silver layer and having a thickness of 500-3000A.

2. A method of making shallow ohmic contact to a n-type gallium arsenide substrate comprising the sequential steps of:
    (a) evaporating in situ a layer of Pd on the surface of the gallium arsenide substrate, such Pd layer having a thickness of 20-100A;
    (b) evaporating a layer of gold germanium on the palladium layer, such gold germanium layer having a thickness of 200-1500A wherein the gallium has a range of 15-50 atomic percent;
    (c) evaporating a layer of silver on the gold germanium layer, such silver layer having a thickness of 500-1500A; and
    (d) evaporating a layer of gold on the silver layer, such gold layer having a thickness of 500-3000A; and
    (e) rapidly thermally annealing the system of deposited layers at a temperature of 375°-500° C. for a time of between 10-60 seconds.

* * * * *